United States Patent [19]

Iwayama et al.

[11] Patent Number: 5,444,188
[45] Date of Patent: Aug. 22, 1995

[54] FLEXIBLE CIRCUIT WIRING BOARD AND METHOD OF PRODUCING THE SAME

[75] Inventors: Takeshi Iwayama; Atsushi Miyagawa; Masaichi Inaba, all of Ushiku, Japan

[73] Assignee: Nippon Mektron, Ltd., Tokyo, Japan

[21] Appl. No.: 117,010

[22] PCT Filed: Jan. 12, 1993

[86] PCT No.: PCT/JP93/00028

§ 371 Date: Sep. 8, 1993

§ 102(e) Date: Sep. 8, 1993

[87] PCT Pub. No.: WO93/14516

PCT Pub. Date: Jul. 22, 1993

[30] Foreign Application Priority Data

Jan. 14, 1992 [JP] Japan .................. 4-024469

[51] Int. Cl.$^6$ .................................. H05K 3/00
[52] U.S. Cl. .................. 174/261; 29/846; 219/121.69; 219/121.67; 219/121.68
[58] Field of Search .............. 219/121.67, 121.68, 219/121.69; 29/846; 174/254, 261; 361/773, 749; 439/77

[56] References Cited

U.S. PATENT DOCUMENTS

| | | | |
|---|---|---|---|
| 4,931,134 | 6/1990 | Hatkevitz et al. | 156/630 |
| 4,978,830 | 12/1990 | Millerick et al. | 219/121.67 |
| 5,065,506 | 11/1991 | Kinbayshi | 29/632 |
| 5,088,008 | 2/1992 | Takeyama et al. | 361/403 |
| 5,278,385 | 1/1994 | Gerome et al. | 219/121.68 |

*Primary Examiner*—Leo P. Picard
*Assistant Examiner*—L. Thomas
*Attorney, Agent, or Firm*—Chilton, Alix & Van Kirk

[57] ABSTRACT

A flexible circuit wiring board having protruding, closely spaced leads, which are intended to be attached to a circuit device, is fabricated by forming a conductor pattern on a first surface of an insulating substrate, adhereing a protection layer to the conductor pattern and employing a laser to selectively etch away the substrate. The etching process leaves a reinforcing coating of the protective layer on the leads at least in the portions thereof which lie at the boundary of the area from which the substrate has been removed.

7 Claims, 3 Drawing Sheets

FLEXIBLE CIRCUIT WIRING BOARD AND METHOD OF PRODUCING THE SAME

BACKGROUND OF THE INVENTION

The present invention relates to the manufacture of flexible circuit wiring "boards" having conductors that protrude, like finger leads, beyond edge(s) of a window portion in the board or beyond an outer edge of the board.

DESCRIPTION OF THE PRIOR ART

A prior art flexible printed circuit, i.e., wiring board, having outwardly protruding conductors in the form of finger leads is shown in FIGS. 4A and 4B. In this prior art circuit board, plural conductors 11 extend outwardly into an aperture or window region 12 provided in a flexible insulating base member 13.

In a flexible circuit wiring board of conventional structure as shown in FIG. 4, the conductors must have a degree of rigidity so that the leads protruding into window region 12 will not be easily deformed. The requirement for rigidity precludes a decrease in the thickness of the conductors 11 of the circuit and thus imposes a limitation on the ability to increase wiring density by finely forming the conductors.

SUMMARY OF THE INVENTION

The present invention provides a flexible circuit wiring board having conductors, protruding in the form of finger leads, which resist deformation even when finely formed. The present invention also encompasses a method of producing such a flexible circuit wiring board having closely spaced conductors.

The protruding conductors, i.e., the leads, of a flexible circuit in accordance with the invention have a flexible insulating resin layer on part of at least one surface thereof, said resin layer having nearly the same width as the conductors and reinforcing the finger leads.

In the practice of the method of the invention, the requisite circuit wiring pattern is formed on one surface of an insulating base member, i.e., an insulating substrate. A surface protection layer is then formed on the upper, i.e., the exposed, surface of the conductors which define the wiring pattern. The surface protection layer defines cut-away portions in locations where the finger lead-like circuit wiring conductors are to be formed. The beam provided by an excimer laser is directed to the second surface of the substrate in order to remove an area of the insulating base member thus leaving outwardly extending finger lead-like circuit wiring conductors with the surface protection layer on one side thereof.

The present invention also encompasses the formation of the cut-away portion(s) in the surface protection layer by directing the excimer laser beam at the exposed surface of the surface protection layer after the substrate has been removed to form the finger lead-like circuit wiring conductors.

DESCRIPTION OF THE DISCLOSED EMBODIMENT

Figure 1:
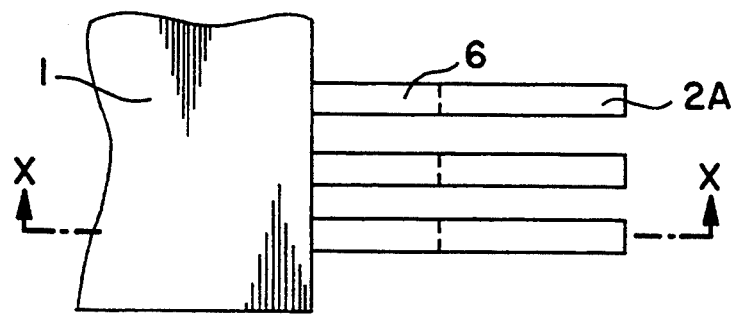
FIG. 1 is a partial top plan view which schematically illustrates a flexible circuit wiring board in accordance with a first embodiment of the present invention.
Figure 2:
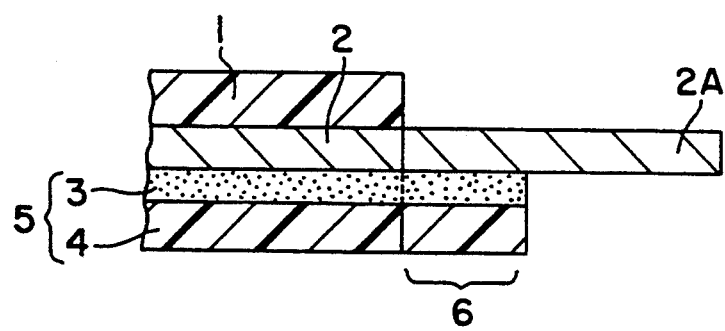
FIG. 2 is a cross-sectional, side elevation view taken along line X—X of FIG. 1.

FIG. 1 is a plan view which schematically illustrates portions of a flexible circuit wiring board in accordance with a first embodiment of the present invention, and FIG. 2 is a sectional view taken along line X—X of FIG. 1.

In FIGS. 1 and 2, a flexible insulating base member, comprised of a polyimide film or the like, is indicated at 1. A circuit wiring pattern, formed on one surface of base member 1, is indicated at 2. Wiring pattern 2 includes conductors 2A, in the form of finger leads, that protrude beyond an edge of the flexible insulating base member 1. This edge may, for example, be a side boundary of a rectangular shaped window provided in base number 1. The circuit wiring pattern 2 and the finger lead-like circuit wiring conductors 2A, in one reduction to practice, have a width of 50$\mu$m and a thickness of 17.5 $\mu$m.

The circuit wiring pattern 2, except portions of the protruding conductors 2A in the disclosed embodiment, is covered with a surface protection layer 5 consisting of an adhesive layer 3 and a flexible insulating film 4 which may be a polyimide film or the like. The surface protection layer 5 extends over portions of the protruding conductors 2A. The width of the surface protection layer 5 on the protruding conductors 2A is nearly the same as the width of the conductors 2A themselves. Thus, as may be seen from FIGS. 1 and 2, the surface protection layer 5 on the portions of the protruding conductors 2A which are adjacent to the boundary edge of the window in base member 1 form terminal reinforcing portions 6.

Figure 3A:
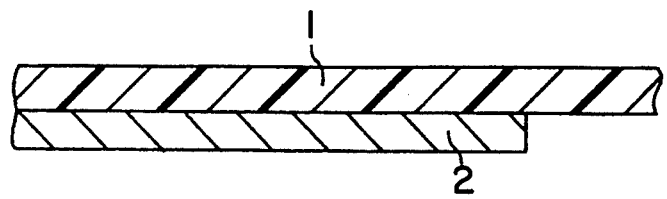
FIGS. 3A through 3C are diagrams illustrating steps performed in the production of the flexible circuit wiring board of FIGS. 1 and 2.
Figure 3B:
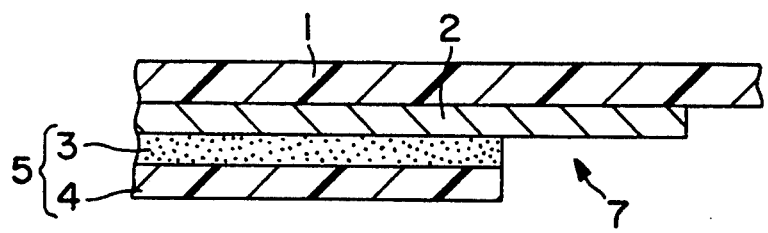
Figure 3C:
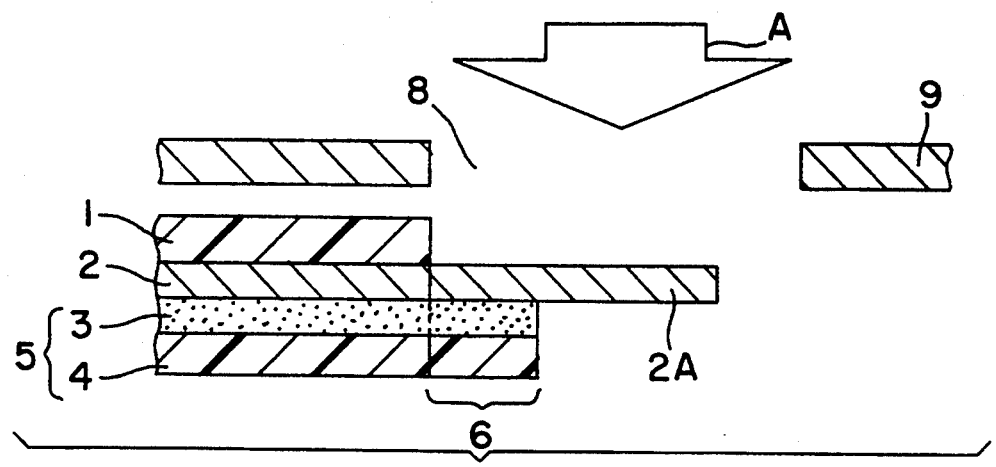
Figure 4A:
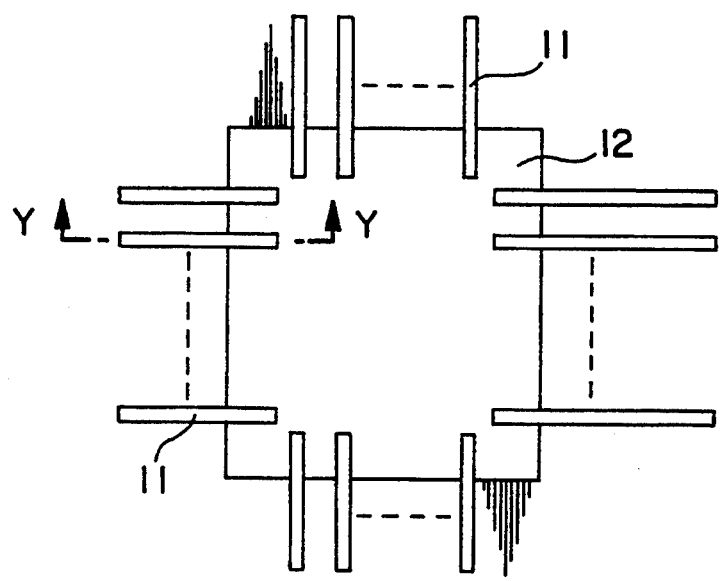
FIGS. 4A and 4B are, respectively, views similar to FIGS. 1 and 2 which show the prior art.
Figure 4B:
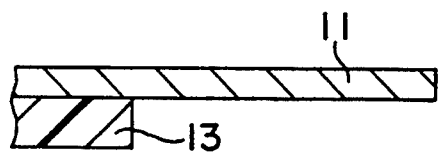

FIGS. 3A through 3C illustrate steps employed in producing the above-described flexible circuit wiring board. Thus, FIG. 3A shows a flexible, copper-clad laminate to which an adhesive may or may not be applied. This laminate comprises the flexible insulating base member 1 which supports the wiring pattern 2, the wiring pattern being formed on one surface of base member 1 by techniques which are known in the art and do not comprise part of the present invention.

Referring to FIG. 3B, the surface protection layer 5 is formed over conductor pattern 2 and consists of an adhesive 3 and a flexible insulating film 4. The insulating film 4 may be a polyimide film. The surface protection layer 5 defines a cut-away portion 7 within the area where the circuit wiring pattern 2 is to be exposed in the form of finger leads. Obviously, there may be more than one cut-away portion 7.

As schematically illustrated in FIG. 3C, the beam A provided by an excimer laser is projected from the side of the flexible insulating base member 1 which is opposite to the side on which the circuit wiring pattern is formed. The laser beam A is directed against the base member 1 via a metal mask g, i.e., the high intensity light from the laser will pass through an aperture 8 in mask g and will remove the insulating base member 1 as well as any underlying surface protection layer 5 which is not shielded by a conductor portion 2A. Accordingly, the circuit wiring conductors 2A, with terminal reinforcing portions 6 of surface protection layer 5, will remain in an area, i.e., a window, which corresponds to the dimensions of the aperture 8 in mask 9.

To summarize the above, since the circuit wiring conductors 2A block the excimer laser beam A, the surface protection layer on the surface of the circuit wiring conductors 2A disposed opposite to the direction of illumination with beam A forms terminal reinforcing portions 6 having the same width as the circuit wiring conductors 2A.

In the above-described procedure, the cut-away portion(s) 7 of the surface protection layer 5 can also be formed by directing the excimer laser beam to the exposed side of the surface protection layer 5 after the flexible insulating base member 1 has been removed in the manner described above and depicted in FIG. 3C.

In the case where the surface protection layer 5 is etched employing the excimer laser beam, the flexible insulating base member 1 may be partly used to reinforce the finger lead-like circuit wiring conductors 2A, i.e., the cut-away portions of the surface protection layer may encompass an area greater than the portions of the flexible insulating base member 1 which are removed using the laser beam.

In the above-mentioned steps of removal of non-conductive material, the excimer laser beam can alternately be projected to the work through a lens and a mask may be placed on the optical path. The present invention also permits the circuit wiring pattern to be formed on one surface of a flexible laminate which is clad with copper on both surfaces thereof. A mask for shutting off the excimer laser beam is formed on the surface of the laminate opposite to that on which the wiring pattern is formed in order to define a window of the desired size at a desired place, and the mask is removed after the etching of the substrate is completed.

A flexible circuit wiring board produced in accordance with the present invention is characterized by conductors which protrude in the form of finger leads and have a flexible insulating resin layer of nearly the same width as the conductors at portions on at least one surface thereof. These resin layers will be disposed in regions extending from the edges of the areas into which the conductors protrude and contribute to increasing the rigidity of the finger leads.

The present invention permits a reduction in the thickness of the circuit wiring conductors of a flexible circuit wiring board and thus permits the formation of higher density wiring patterns than previously permitted. Restated, because of the presence of a reinforcing resin layer thereon, the leads extending from a fine circuit wiring pattern will not be unduly subject to deformation.

We claim:

1. A method of producing flexible circuit wiring boards comprising the steps of:

forming a circuit wiring pattern consisting of plural conductors on one surface of an insulating base member;

adhering a surface protection layer to the exposed surface of said circuit wiring pattern, the surface protection layer defining at least a first cutaway portion at a location where conductors of said wiring pattern are to be terminated as projecting finger-like leads; and removing the insulating base member from areas where the leads are to be formed by projecting the beam of an excimer laser onto said base member.

2. The method of claim 1, further comprising forming the cut-away portion of the surface protection layer by projecting the excimer laser beam onto the exposed surface of the protection layer to remove a portion of said layer.

3. The method of claim 1 wherein the step of removing the base member comprises removing the base member from portions of the wiring pattern to which the surface protection layer was adhered in an area which is in registration with the cut-away portion of the surface protection layer and in an adjoining area which extends from a boundary of the cut-away portion whereby the projecting leads in part are reinforced by a surface protection layer coating on one side thereof.

4. The method of claim 1 wherein the beam of the laser is projected onto said base member through a mask, the mask having an aperture which defines the area of the base member to be removed.

5. The method of claim 4, wherein the area of the base member to be removed is larger than the area of the cut-out portion of the surface protection layer.

6. The method of claim 1 wherein the leads shield the surface protection layer adhered thereto during the removing of the insulating base member.

7. The method of claim 2 wherein the step of forming the cut-away portion of the surface protection layer is performed after the removing of the insulating base member.

* * * * *